United States Patent
Bensaoula

Patent Number: 6,054,333
Date of Patent: Apr. 25, 2000

[54] REAL TIME ETCH MEASUREMENTS AND CONTROL USING ISOTOPES

[75] Inventor: Abdelhak Bensaoula, Houston, Tex.

[73] Assignee: University of Houston, Houston, Tex.

[21] Appl. No.: 08/950,344

[22] Filed: Oct. 14, 1997

[51] Int. Cl.[7] .................................................. H01L 21/00
[52] U.S. Cl. .................................. 438/9; 438/14; 438/16; 216/60
[58] Field of Search .................................. 438/7, 8, 9, 14, 438/16; 216/59, 60, 84, 85

[56] References Cited

PUBLICATIONS

Hammond, Schultz and Krauss, "Surface Analysis at Low to Ultrahigh Vacuum by Ion Scattering and Direct Recoil Spectroscopy", J. Vac. Sci. Technology A, 13, 1136, (1995).
Waters, Bensaoula, Schultz, Eipers–Smith, And Freundlich, "In–Situ Doping and Composition Monitoring for Molecular Beam Epitaxy Using Mass Spectroscopy of Recoiled Ions", J. Crys. Growth 127 (1993) 972–975.
Frees, "New In–Situ Monitoring Technology", Semiconductor Fabtech, 149–151.
Haller, "Isotopically Engineered Semiconductor", J. Appl. Phys. 77 (1995) 2857–2878.

Primary Examiner—William Powell
Attorney, Agent, or Firm—Baker Botts L.L.P.

[57] ABSTRACT

A method is provided for determining etching characteristics during gas phase etching of thin film materials such as semiconductors during manufacture of devices. Etch end point, rate of etching, uniformity of etching and uniformity of growth of thin films can be determined. Isotopically enriched materials are deposited in layers which may be only a few nanometers thick at selected locations during growth of the thin films. The isotopes are removed during gas phase etching, carried by gas into an analysis chamber, condensed on a surface, and analyzed for isotopical composition. Mass spectroscopy of recoiled ions is a preferred detection technique.

31 Claims, 5 Drawing Sheets

REAL TIME ETCH MEASUREMENTS AND CONTROL USING ISOTOPES

FIELD OF THE INVENTION

This invention relates to etching of epitaxially or non-epitaxially grown thin film materials. More particularly, method is provided for determining etch rate, etch end point and uniformity of etch using isotopically engineered materials.

BACKGROUND OF THE INVENTION

The drive toward higher performance electronic and opto-electronic devices requires the use of materials of highly tailored electrical and optical properties. The materials are usually crystalline alloys deposited in complex stacking arrangements. While the technologies for depositing the stacked layers have been greatly improved, there is need for more innovation in the etching technologies which are specifically designed for these multi-component alloys. Furthermore, these advanced devices usually rely on active areas which are only a few monolayers thick, thus requiring precise control over etch rates for reproducible end point detection. To overcome this problem, it is usually necessary to include etch stop layers in the device structure, complicating the growth and adding additional steps in the fabrication process. Several other approaches are possible. The thickness of the film may be measured optically by interferometry or other optical means. The presence of a reaction product or the absence of a reacting chemical species can also be monitored and used to determine when the film etching is complete. Detection in these latter two cases can be either by optical or by mass spectroscopy methods, but an interface between different chemical compositions is necessary for detection. When commercially available differentially pumped mass spectrometers are used, very complex spectra are normally obtained which are difficult to interpret.

The use of enriched isotopes is well known in a variety of fields of science. There is a class of applications called "isotopic engineering," where both precise control of isotope composition and large enough quantities to allow use of the isotopes in multiple samples are possible. Although the isotopes may be used in a production process, extremely small quantities may be used. A recent review includes a discussion of scientific knowledge gained through studies of isotopically controlled semiconductor crystals and a discussion of future possibilities offered through isotope control of a wide range of semiconductor materials (Haller, "Isotopically Engineered Semiconductors." i J Appl. Phys. 77 (7), 1995). The author of this review discusses superlattices grown with enriched isotopes and the doping of isotope layers using Neutron Transmutation Doping (NTD). The availability of highly enriched isotopes of semiconductor elements has been a bottleneck in the development of their use. However, greater availability is increasingly apparent and it is possible to use only an increase of a certain isotope (in contrast to greater than 90% pure) or extremely thin epilayers to achieve practical results. The author estimates that the prices of isotopes will drop from the current prices of more than $1,000 per gram for pure isotopes to a range less than $100 per gram when substantial demand for the isotopes arises. This latter price is comparable to current prices for high purity source materials for thin film growth. The materials will thus become even more feasible for production-scale device fabrication.

There is a body of work using isotopically tagged precursors in epitaxial growth in both group IV and in groups III–V compounds. It is clear that the science and technology of chemical compound synthesis is capable of delivering isotopically tagged materials with the purity and reproducibility necessary for production-scale, semiconductor thin film growth. Heterostructures with submonolayer sharp interfaces and precise doping profiles have been reproducibly demonstrated. To date, many deposition methods have been shown to be efficient growth technologies for such heterostructures.

Methods are needed for improving device fabrication processes employing gas phase etching. One such improvement needed is an end point detection during etching of heterostructures. This might include a signal to a process controller to cause the process to go into a slower etch mode or shut down in a preprogrammed time interval during an etch process. There is also a need for real time markers for calibration of the rate of an etching process. This is particularly important in compound semiconductors where etch chemistries are highly complex and etch rates vary significantly with alloy composition and dopant levels. A method is needed which does not affect etch chemistry and can be used when no difference in chemical composition exists. The process should be workable at an interface where only a slight composition variation exists or where only a change in dopant level is present. It also should be applicable in processes using selective area chemical beam epitaxy growth followed by chemical beam etching. The method should require only extremely thin layers, so that it has negligible effect on epitaxial processes or requires minimum amounts of expensive isotopically pure chemical materials. There is also a need for methods to assess the etch uniformity of processes. Similarly, a method is needed to assess the uniformity of an epitaxial growth process. Sensitivity sufficient to allow operation of the process when extremely low surface area percentage area openings (vias) exist during etching is needed, using labeled layers that can be detected with very high signal to noise ratios, such that the process will be applicable to design geometries even below 0.33 micron and etch areas below 1 per cent of total wafer area.

SUMMARY OF THE INVENTION

Method is provided for detecting the end point of etch processes which can be used within the same material or at interfaces within heterostructures. An isotopically enriched layer is deposited during epitaxial or non-epitaxial growth of a thin film at a known location or near the interface where the end-point of etching should occur. In one embodiment, the presence of the isotopically enriched layer is detected using a method employing condensation of the exit gases from the reactor on to a solid surface in a separate analysis chamber, formation of ions from the deposited solid surface using an ion gun and detection of the ions, preferably using mass spectroscopy of recoiled ions (MSRI). In another embodiment, the MSRI instrumentation is included in an etch reactor and the ion beam is directed onto the surface being etched. In either of these embodiments, signals from the mass spectrometer may be used in a feedback loop to control or stop the etching process. Although MSRI is used in the preferred embodiment, a differentially pumped mass spectrometer may be used if the resulting spectra from the isotopically enriched layer can be interpreted.

In yet another embodiment, a method is provided for determining the uniformity of etch rate during an etching process. The signal from a mass spectrometer is analyzed to determine line width as a layer of isotopically altered material is etched into or through. A narrow peak width indicates uniformity of the etching process. In yet another embodiment, a method is provided for determining the uniformity of deposition of epitaxial growth. In this method, a layer that has been grown is then etched away under known conditions of uniformity of etch rate or over selected areas of the growth surface.

DETAILED DESCRIPTION OF PREFERRED EMBODIMENT

Figure 1A:
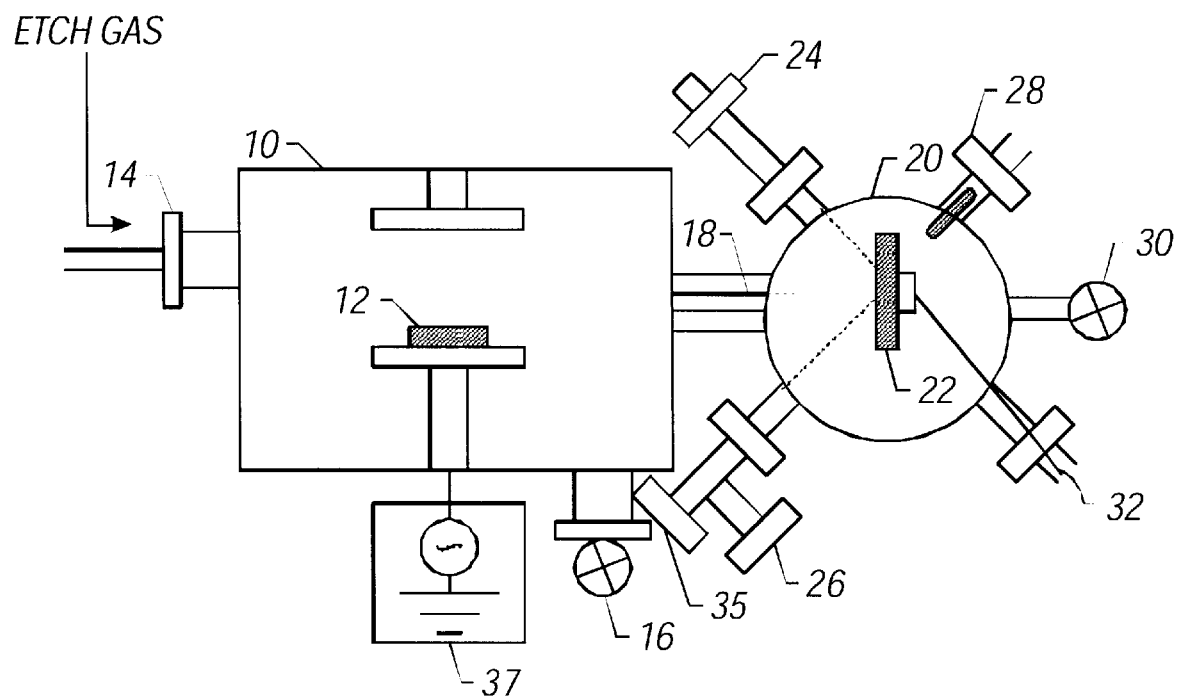
FIG. 1A is a sketch of a reactive ion etch reactor and an analysis chamber used in the method of this invention.

Referring to FIG. 1A, reactive ion reactor 10 is shown containing wafer 12 which is under etch conditions. Etching agent (etch gas) enters through inlet tube 14 and exits through capillary nozzle 18. The chemical composition of etch gases is widely known. Vacuum is maintained in reactor 10 by main vacuum pump 16. Gas containing unreacted etchent, a carrier gas and products of the etching reaction flows through capillary nozzle 18 into analysis chamber 20. Sample block 22, having cryogenic cooling and heating capabilities, causes components of gas entering chamber 20 to condense on the solid surface of sample block 22. Sample block 22 may be cooled by fluid or other means entering through mechanical support 32. Ion gun 24 directs a beam of ions such as neon, argon, xenon or alkaline earth ions such as $K^+$ or $Na^+$ to the solid surface at an energy of a few KeV. Recoiled ions and neutrals are released from the top layers of the solid surface of the condensed material on sample block 22. Direct recoil neutrals and ions are detected in line-of-sight end point detection mass spectrometer 35, which is a conventional time-of-flight based analyzer, and only recoiled ions are deflected into an electrostatic or reflectron-type time-of-flight based spectrometer 26 (thus the technique name—mass spectroscopy of recoiled ions, or MSRI). Conventional spectrometer (RGA) 28 may be used to analyze contents of analysis chamber 20. Power supply 37 supplies RF power to the reactor.

Figure 1B:
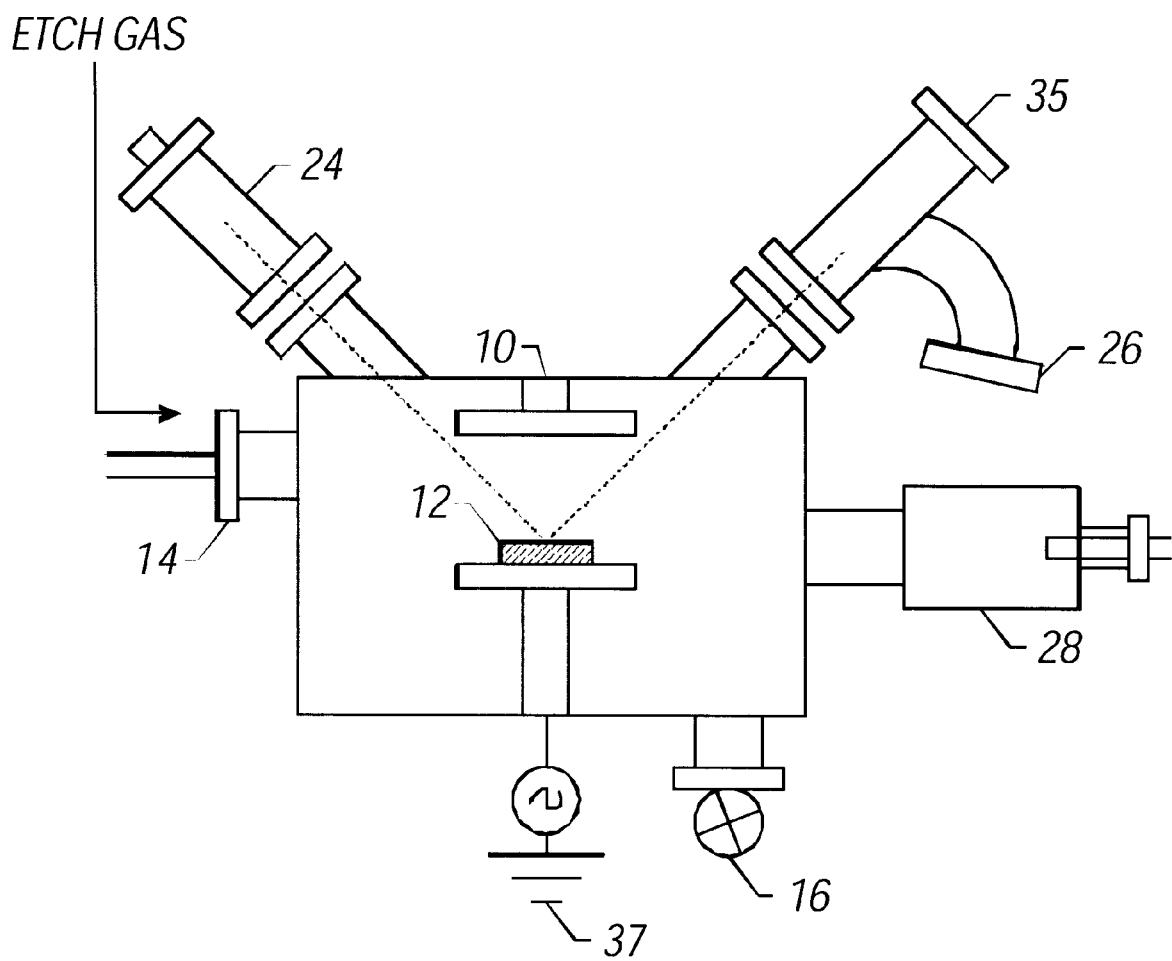
FIG. 1B is a sketch of a reactive ion etch reactor having apparatus included for use in the method of this invention.
Figure 2A:
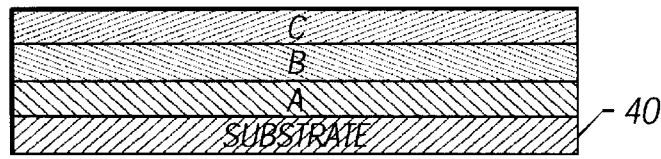
FIGS. 2(a)–(e) are sketches of a heterostructure and an etch process occurring through openings in a resist layer.
Figure 2B:
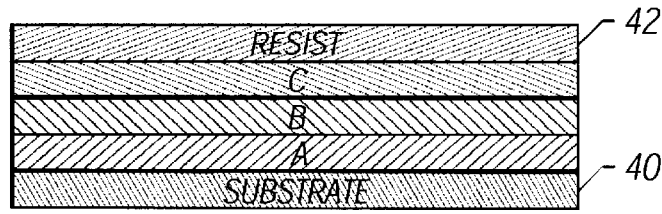
Figure 2C:
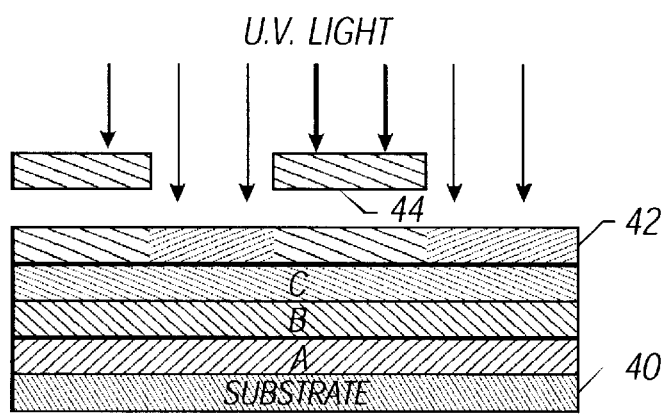
Figure 2D:
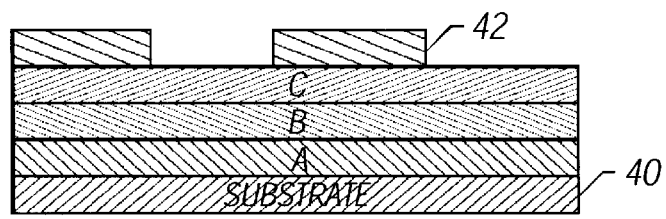
Figure 2E:
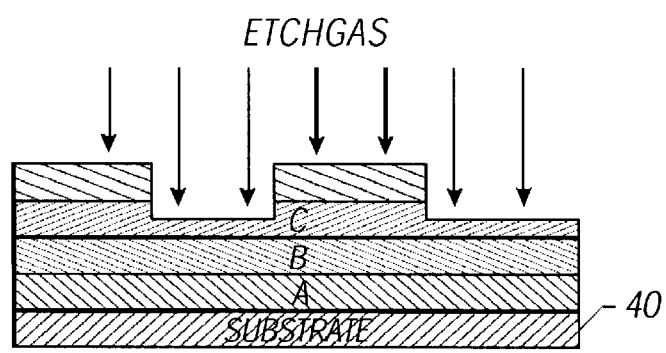

In another embodiment, shown in FIG. 1B, the analysis chamber may be eliminated and ion gun 24 and spectrometers 26, 28 and 35 may be connected to reactor 10. In this case, the ion beam from ion gun 24 is directed on to wafer 12 as it is being etched. Other numerals denote the same equipment as shown in FIG. 1A.

Various techniques are known for detecting isotopes. The most common is mass spectrometry. This is a standard method which is available in etch reactors, but the mass spectrometry technique has many variants, ranging from quadrapole mass spectrometry to time-of-flight mass spectrometry. All such mass spectrometry techniques detect molecular species as well as their fully or partially dissociated constituents. For techniques useful in materials such as gallium arsenide, isotope resolution is necessary between the chloride compounds of $Ga^{71}$ versus the compounds of $Ga^{69}$. Spectra from one gaseous specie are usually rather complicated and have many peaks. Therefore, for some systems the technique produces ambiguous results or it is impossible to differentiate between compounds that have the same cracking pattern. For those applications particularly, the use of mass spectrometry and recoiled ions (MSRI) can be used. This technique is based on time-of-flight mass spectrometry where the detected species are ions which are separated from recoiled neutral species and deflected into an electrostatic or a reflectron-type mass analyzer. This technique can be used in much higher ambient pressure conditions than time-of-flight-secondary ion mass spectroscopy (TOF-SIMS), which has been widely used. The technique has been described, for example, in the paper "Surface Analysis at Low to Ultra-High Vacuum by Ion Scattering and Direct Recoil Spectroscopy," *J. Vac. Sci. Technol.*, 1995, which is incorporated by reference herein.

The demonstrated mass resolution of the MSRI technique is significantly better than most quadrapole-based SIMS instruments, and a dynamic range of $10^9$ and mass resolution of 400 at mass 238 has been achieved with a data collection time of under 1 second. Time-of-flight ion scattering and recoil spectroscopy and mass spectrometry recoil ion (TOF-ISRS/MSRI) techniques have been shown to be powerful for a variety of applications. The technique allows isotope mass resolution and ratio determination to better than 0.1% for all elements including hydrogen. Sensitivity has already been demonstrated to allow dopant level measurements ("Insitu Doping in Composition Monitoring for Molecular Beam Epitaxy Using Mass Spectroscopy of Recoiled Ions," *J. Crys. Growth*, 1993, which is incorporated by reference herein.

Differential pump 30 maintains vacuum in the sample chamber. The MSRI technique is operable at higher pressures than other electron- or ion-based techniques. Ambient pressures at least up to 20 millitorr and detector-substrate distances of at least 20 cm are possible. The conventional mass spectrometer (MS) has many variants, ranging from quadrapole MS to TOF-MS. For the method of this invention, it is necessary to have isotopic resolution of the reaction compounds (for example, $Ga^{71}Cl_3$ from $Ga^{69}Cl_3$). Current MS technology will allow this amount of resolution with some etch chemistries. But all MS technologies detect molecular species, and therefore spectra are complicated and in some systems it is impossible to differentiate between compounds that have different isotopes of the same element as their constituents. For those systems, the MSRI detection method is necessary and electrostatic mass spectrometer 26 of FIG. 1A or FIG. 1B is used. For other systems, use of isotope labelling in conjunction with standard mass spectrometry techniques might be sufficient.

Analysis chamber 20 of FIG. 1A may contain more than one sample holder and may also contain more than one ion gun. In that case, there can be periodic warm-up of the cryosurface of a sample holder to allow cleaning and regenerating while another sample holder is being used for analysis.

FIG. 2 shows a sketch of a heterostructure which is to be etched. FIG. 2(a) shows layers A, B & C deposited on substrate 40. These layers may be from a few nanometers (nm) in thickness to several microns in thickness. FIG. 2(b) shows that resist layer 42 has been deposited over layer C. FIG. 2(c) shows the development of the resist layer using UV light which is directed by mask 44 onto selected areas of resist layer 42. In FIG. 2(d) resist layer 42 has been selectively removed using well known techniques to expose layer C which is to be etched. FIG. 2(e) shows etch gas in the process of etching through layer C. In device manufacture, it may be desirable to etch only part way through layer C to a depth where dopant concentration changes, for example, or to a certain depth for other reasons. Using the method of this invention, the depth at which it is desired to stop etching can be detected.

Figure 3:
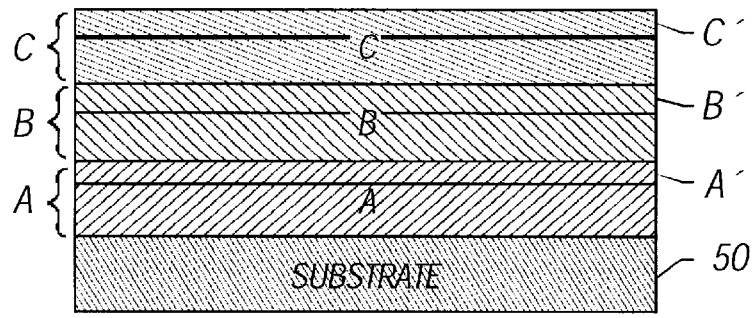
FIG. 3 is a sketch of isotopically labelled sublayers used to detect interfaces in a heterostructure.

Referring to FIG. 3, layers A, B, and C have been grown on substrate 50. During the growth of each layer, sublayers, A', B', and C' containing isotopically enriched material have been grown. These sublayers can be used to detect the interfaces. An increase in concentration of the isotopically enriched material in B', for example, can show that an etch process has entered layer B. Analogously, sublayer A' can be used to detect the interface between layers A and B.

Figure 4:
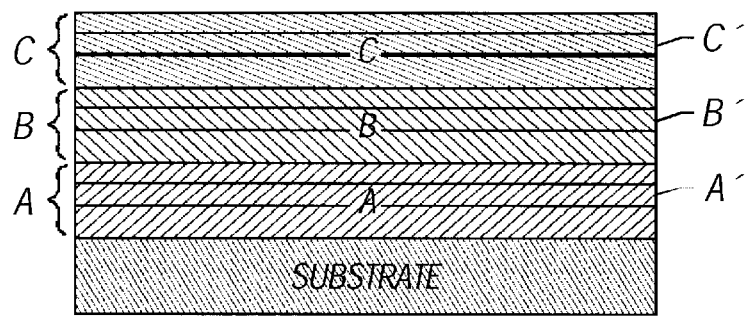
FIG. 4 is a sketch of isotopically labelled sublayers used to measure etch rates in real time in a heterostructure.

FIG. 4 shows layers A, B, and C and the isotopically enriched sublayers A', B', and C', but in this case the sublayers are located within each of the layers of A, B, and C. If the isotopically labeled layers are placed at a known separation from the interfaces between layers A, B and C, then these locations can be used to measure etch rates in each of the layers A, B, and C. Etch rates may vary in each material due to varying compositions of the material or because of other variables affecting etch rate.

Figure 5:
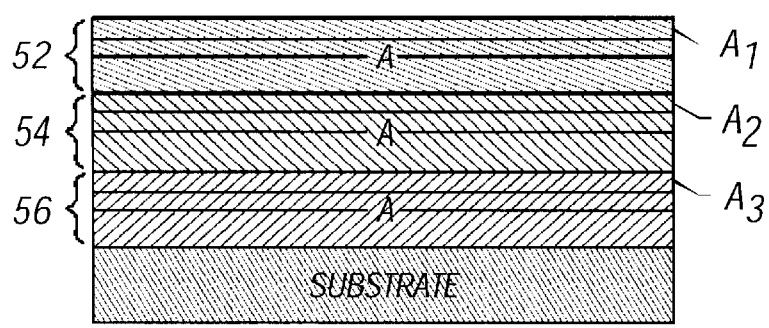
FIG. 5 is a sketch of isotopically labelled sublayers to measure etch rate and etch uniformity for a structure made of the same material doped at different levels.

Referring to FIG. 5, layers 52, 54 and 56 are shown, which represent the same alloy material, such as exists in layer A, with different levels of dopant. The material in layer A may be, for example, gallium arsenide. Sublayers A1, A2 and A3 are isotopically enriched sublayers within each of the layers having different levels of dopant. Measurement of the concentration of isotopically labelled materials in the effluent gas from a reactor in which etching is occurring through the layers 52, 54 and 56 can be used to measure etch rate through the materials. Etch uniformity can also be indicated, as will be described below.

Figure 6:
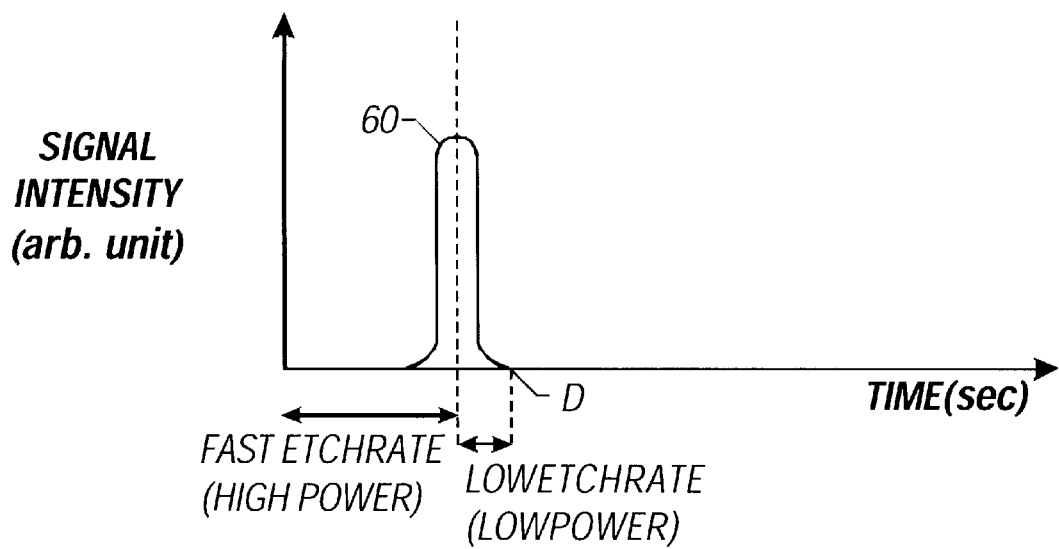
FIG. 6 is a graph of signal intensity for an isotope versus time of etching from a structure using isotopically labelled materials to enhance end point detection.

Referring to FIG. 6, typical signal 60 showing concentration of isotopically altered material that is expected from a structure using isotopically labeled materials to detect an end point of an etch process is shown. Signal intensity is obtained from the end point detection chamber 26 of FIG. 1. This could also be obtained using the MSRI technique directly on the sample under etch or a standard differentially pumped mass spectrometer. The etching process may be approaching A' such as shown in FIG. 3, for example, where it is desired to etch through the layer A' but not below A'. A fast etch rate is used, which can be achieved by operating a plasma etch at high power, for example, down to the point where the signal from the layer A' peaks. Then power applied to the reactor by power supply 37 (FIG. 1) is reduced, so that a low etch rate is achieved. When the layer A' has been etched, minimum concentrations of the etchant reaction materials are found, as at the point D in FIG. 6.

Figure 7:
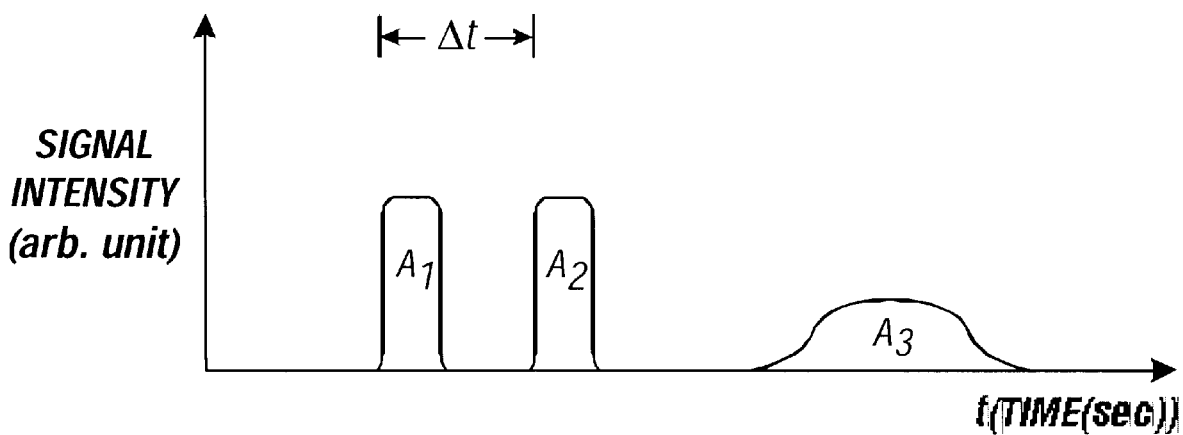
FIG. 7 is a graph of signal intensity versus etch time for a structure using three different isotopically labeled sublayers to determine etch rate and etch uniformity.

Referring to FIG. 7, a signal expected from etching through a heterostructure having three isotopically labeled layers is shown. Such a structure is shown in FIG. 5. The sublayers are deposited at known distances apart because deposition or growth rate is held constant throughout the growth phase (parameters are not changed). To determine the absolute value of growth rate, either ex-situ measurements of film thickness are made by TEM or SEM, for example, or in-situ (real time) measurements of film thickness are made by electron-based techniques such as RHEED or by optical techniques such as ellipsometry. The growth rate is usually known to within 0.1 per cent and is fairly reproducible.

The first peak, from material in sublayer A1, is observed as the etch penetrates that sublayer. The second peak occurs when the etch process reaches sublayer A2. The difference in time between the peaks corresponding to sublayers A1 and A2 provides a measure of etch rate, since sublayers A1 and A2 are at a known distance apart. After a period of further etching, layer A3 is approached and is etched through, as shown in FIG. 7. The broad peak from sublayer A3 indicates that the etch rate is much less uniform when this layer is etched. Information from uniformity of etch can be indicative of the quality of devices made using the etching process and etching conditions. This means of determining uniformity of etch by measuring the shape of the signal from isotope layers can be useful in improving etching processes used in device manufacture.

The isotope methods described herein can also be used to indicate growth uniformity over a wafer. In one embodiment, MSRI is used during growth of a thin film over an underlying layer of different isotope composition and surface coverage at different points of the substrate is measured by measuring differences in the signal from the underlying layer. If the signal is uniform, this indicates uniform growth over the surface. In another embodiment, wherein etch rate uniformity is known, the rate at which the signal from the layer being etched decreases or the rate at which the signal from an underlying layer increases, when deconvolved with the etch rate uniformity using known mathematical techniques, indicates uniformity of growth.

In another embodiment of this invention, output from end point detection chamber 26 (FIG. 1) is applied to controller 35 which is used to control power from power supply 37. Thus, when curve 60 of FIG. 6 increases to the peak, for example, controller 35 can be programmed to decrease the power from power supply 37 and thereby decrease etch rate. This method can allow much more accurate control of total etch distance than is presently available. Adaptive control algorithms may also be implemented using the output of detection chamber 26 to control etch gas flow rate through tube 14, power supplied from power supply 37, pressure applied by main pump 16, flow rate through capillary nozzle 18, or other control variables associated with the etching process occurring in etch chamber 10 or the sampling process occurring in chamber 20.

Using the methods of this invention, the etch stop layers of the prior art are no longer necessary. Detection of end points can be made within the same material and real time etch rate calibration can be performed.

For semiconductor devices containing gallium or indium, suitable isotopes for the methods of this invention are gallium$^{71}$ and indium$^{113}$. These isotopes are available, for example, from PNPI USA Corporation of Houston, Tex. Extremely thin layers such as from 5 to 20 nm can be used. The isotopically enriched layers can be inserted in any device structure during epitaxial or non-epitaxial growth. Growth can be accomplished by any thin film growth technology—evaporation, sputtering, EMOCVD, MOVPE, MBE, CBE, LPE or any other epitaxial or non-epitaxial process. The isotopically modified layers may be deposited just above the end point layer. In an A-layer on B-layer structure (A and B can be the same material), the first few monolayers (less than 2 nm) of A will be grown using an isotopically pure or enhanced element. Detection of the appropriate isotope on the surface or in the effluent gases will be used to signal that the desired or targeted layer is next. In an etch reactor, upon detection, the etch process may be slowed down to allow a more precise control. In this way, fast etch can be implemented throughout but at the last few layers.

Alternatively, throughout the structure and at predetermined intervals (regular or not), isotopically pure or purer layers can be grown. During etching, detection of these layers can be used to calculate the etch rate in real time and modify the process accordingly. Alternatively, the etch uniformity can be assessed by monitoring the ratio of the isotopes upon etching through the isotopically engineered layers. The ratio can be used as a uniformity figure of merit of etch uniformity. A high ratio in the transition region means a very uniform etch rate.

Methods described above may also be used in in situ etch or growth applications. In CBE, for example, one can instantaneously switch from deposition to etching (in growth of GaAs, for example) by switching of inlet gas from $AsH_3$ to $AsCl_3$. Utilization of isotopically engineered layers will permit the direct measurements of these growth and etch rates in real time. For example, two layers can be deposited—A and B. Since etch rate depends on chemistry of the material under etch and etch conditions, the deposition conditions can be varied for layer A and the etch conditions kept constant for etching away layer A down to layer B. Then the time to etch down to layer B indicates the relative deposition rate of layer A, which has constant chemical composition at different deposition rates. Mass spectroscopy of recoiled ions (MSRI) can be utilized to probe the sample surface directly in the reactor or by measuring the downstream gas composition through MSRI (species are cryo-condensed on the holder) or standard MS technique of the reactor. When these processes are in place for the production of devices, the isotope and MSRI combination can be used as a real time process control probe.

Deposition of layers having isotopic labelling can be carried out as follows, using gallium arsenide as an example. Either MBE, CBE, or any other deposition method may be used. For MBE, solid gallium is used along with solid arsenic. The gallium and arsenic are loaded into crucibles which are inserted into effusion cells specifically designed for MBE deposition. Each effusion cell can be shuttered (opened and closed) by way of a mechanical shutter that can be computer controlled. A GaAs device usually consists of stacks of thick layers (greater than 100 nanometers thick). The GaAs layers are either undoped, p-doped, or n-doped. AlGaAs layers may be inserted between the GaAs layers. To implement the isotopic labelling concept, an extra oven is required. The oven will be loaded with the isotopically labelled gallium (usually $Gallium^{71}$ isotope). At specific times the $Gallium^{69}$ shutter on that oven will be closed and the shutter of the $Gallium^{71}$ oven will be opened. For the purpose of this application, only a few monolayers are required, normally less than 5 nm. After a few seconds in the "open" position, the shutter of the $Ga^{69}$ oven is opened and that of the $Ga^{71}$ oven is closed. Different schemes of opening and closing of shutters may be devised for different applications.

If isotopic labeling is used for real time etch rate determination, many isotopically labeled layers may be deposited at known intervals during growth (as shown in FIG. 5). This method can be used either during device fabrication, reactor calibration or process optimization using varying power, pressures and other variables. The growth rate during deposition may be measured using other techniques such as RHEED or ellipsometry. However, as described before, the real time determination of deposition rate is not necessary since the layers will be at intervals which are proportional to deposition times, and the calibration can be done off-line.

An important application of the method of this invention is associated with optimizing etch chemistries and reactor parameters such as pressure, power and other variables for processing for extremely low surface percentage devices by way of etching. This problem will become more difficult as design geometries shrink below 0.33 microns. Conventional end point detection methods are not sensitive enough to permit determination of interfaces which sometimes are below five (5) percent of the wafer surface area. The use of isotopically labeled layers will permit detection of such interfaces, since the labeled layer has a much better signal to noise ratio than conventional layers.

The cost of adding an extra effusion cell or an additional gas injector in a growth reactor is a one-time expense that is minimal. The major expense is in the use of isotopically labeled enriched source materials. The cost of these materials is expected to drop, but even under conditions of expensive isotopically enriched materials, the use of the methods of this invention offers significant advantages. Assuming that the cost of $Ga^{71}$ in small quantities is $7 per mg, the cost of the isotope is about one-thousand times higher than the cost of natural abundance gallium. The application for the material, however, is in most instances of the order of 1 to 1000 ratio between the labeled and standard layers. Thus, in the worst case scenario the cost of source material will be doubled. But for the overall deposition process, source materials cost is less than ten percent of total run cost. Therefore, the incorporation of isotopically labeled materials in device processing will not be cost prohibitive even at present costs of many isotopes. This is because of the extremely high sensitivity of the methods of this invention.

EXAMPLE 1

Isotopically modified layers are inserted during the growth of a gallium arsenide junction device. It is desired to stop the etch at the interface between a negatively doped and positively doped region of a gallium arsenide tunnel junction. The materials are similar at the interface, so optical emission techniques are not possible. A stop etch layer, such as a thin aluminum gallium arsenide layer, cannot be used for the junction because it will significantly modify the performance of the device.

Elemental gallium (if the MBE process is used) or a gallium compound (if CBE or MOCVD is used) is deposited for the whole structure except for a few nanometers at the interface. In this thin layer at the interface, $Gallium^{71}$ is used. During the etching process using a chlorine-based gas, downstream mass spectrometry is used to detect the $Gallium^{71}$ effluent compound. Upon detection of the $Gallium^{71}$ signal the etch process is slowed down by a controller which lowers the RF power supplied to the reactor. Etching continues for a preset time sufficient to allow etching of the isotopically engineered layered.

EXAMPLE 2

During the growth of gallium arsenide junctions in a production process, at known thicknesses in the structures isotopically engineered layers of $Gallium^{71}$ are grown. These layers are a few nanometers thick. The growth rate in the epitaxial process is linear with time and is very accurately determined. During the etch through the epitaxially grown material, the signature of the isotopes is followed and the etch rate determined by measuring the time between etching of successive layers. After obtaining an etch rate for one set of etching conditions, reactor parameters are changed and etch rate is again measured using a next set of isotopically engineered layers. In this fashion reactor calibration is verified and fine-tuned in real time. This procedure to determine etch rate under known conditions in a reactor is used on a daily basis during a manufacturing process.

The foregoing disclosure and description of the invention and preferred embodiments are illustrative and explanatory thereof. Variations and modifications may be made, as would be apparent to those skilled in the art, without departing from the spirit of the invention. They are to be considered as within the scope of the following claims.

What is claimed is:

1. A method for determining characteristics of an etching process while etching a solid thin film with a reactive gas to produce etch products, comprising the steps of:

depositing at least one layer of isotopically enriched material at a known location during growth of the solid thin film;

while etching the thin film in an etch reactor, directing an ion beam on to a surface to be analyzed so as to form ions and neutral molecules from the surface;

analyzing the ions or the neutral molecules by a mass spectrometer detecting the isotopically enriched material and producing an output data stream; and determining the characteristics of the etching process from the output data stream of the spectrometer and the known location of at least one layer of the isotopically enriched material.

2. The method of claim 1 wherein the known location of the layer of isotopically enriched material is at a compositional interface within the solid thin film.

3. The method of claim 1 wherein the known location of the layer of isotopically enriched material is at a selected depth below the surface of the solid thin film.

4. The method of claim 1 wherein the known location of the layer of isotopically enriched material is at a selected difference in depth from another layer of isotopically enriched material.

5. The method of claim 1 wherein the surface to be analyzed is a surface of a sample block in an analysis chamber and further comprising the step of forming the surface to be analyzed by transporting the etch products from the etch reactor to the analysis chamber and condensing the etch products on to the sample block.

6. The method of claim 1 wherein the surface to be analyzed is the surface of the solid film being etched.

7. The method of claim 1 wherein the isotopically enriched material is a pure isotope of the element to be detected.

8. The method of claim 1 wherein the isotopically enriched material is an enriched mixture of the isotope to be detected.

9. The method of claim 8 wherein the isotope is an isotope of gallium or indium.

10. The method of claim 1 wherein the mass spectrometer detects only ions.

11. The method of claim 1 wherein the mass spectrometer detects neutral molecules.

12. The method of claim 1 wherein the output data stream from the spectrometer is used to calculate the uniformity of the etching process.

13. A method of determining the uniformity of growth during formation of first and second layers of a solid thin film, comprising the steps of:

depositing at least one uniform layer of isotopically enriched material at a known location during growth of the solid thin film;

while etching the thin film in an etch reactor, directing an ion beam on to a surface to be analyzed so as to form ions and neutral molecules from the surface;

analyzing the ions or the neutral molecules by a mass spectrometer detecting the isotopically enriched material and producing a first output data stream;

depositing a first and a second layer of a solid thin film for which uniformity of deposition is to be determined, the first and second layers having differing amounts of isotopically enriched material;

etching from the second to the first layer while directing an ion beam on to a surface to be analyzed so as to form ions and neutral molecules from a surface being etched;

analyzing the ions or the neutral molecules from the surface being etched by a mass spectrometer detecting the isotopically enriched material and producing a second output data stream; and deconvolving the data from the first and the second output data stream to determine the uniformity of growth of the second layer over the first layer.

14. A method for controlling an etching process while etching a solid thin film with a reactive gas, comprising the steps of:

depositing at least one layer of isotopically enriched material at a known location during growth of the solid thin film;

while etching the thin film in an etch reactor, directing an ion beam on to a surface to be analyzed so as to form ions and neutral molecules from the surface;

analyzing the ions or the neutral molecules by a mass spectrometer detecting the isotopically engineered material and producing an output data stream; and applying the output data stream to a controller to control the etching process.

15. The method of claim 14 wherein the controller controls the electrical power applied to the reactor.

16. The method of claim 14 wherein the controller determines the composition of the etch gas.

17. A method for determining an etch depth in a solid thin film being etched with a reactive gas, comprising the steps of:

depositing a layer of isotopically enriched material at a known location during growth of the solid thin film;

placing the solid thin film in an etch reactor having an inlet gas conduit and an outlet gas conduit;

introducing into the inlet gas conduit a reactive gas so as to etch the solid thin film and produce a reaction product;

directing a gas containing the reaction product from the outlet gas conduit into an analysis chamber;

condensing the reaction product entering the analysis chamber on to a sample block in the chamber to produce a surface of condensed reaction product;

bombarding the surface of the condensed reaction product to produce bombardment products and collecting the bombardment products in a mass spectrometer for analysis; and observing the signal from the mass spectrometer apparatus to detect the presence of the layer of isotopically engineered material and determine the location of etching.

18. The method of claim 17 wherein the isotopically engineered material is a selected pure isotope.

19. The method of claim 17 wherein the isotopically engineered material is an enriched mixture of isotopes.

20. The method of claim 17 wherein the isotopically engineered material is Gallium$^{71}$.

21. The method of claim 17 wherein the isotopically engineered material is deposited as a sublayer within a layer having the same chemical composition.

22. The method of claim 17 wherein the isotopically engineered material is deposited as a layer between layers having differing chemical composition.

23. The method of claim 17 wherein the layer of isotopically engineered material has a thickness in the range from about 2 nm to about 20 nm.

24. The method of claim 17 wherein the mass spectrometer apparatus is a time-of-flight or secondary ion mass spectrometer.

25. The method of claim 17 wherein the mass spectrometer apparatus selectively detects ions.

26. The method of claim 17 wherein the analysis chamber contains a plurality of condensation blocks.

27. A method for etching a thin film, comprising the steps of:

depositing a layer of isotopically engineered material during growth of the solid thin film;

placing the solid thin film in an etch reactor having an inlet gas conduit and an outlet gas conduit and means for controlling at least one etch rate parameter;

introducing into the inlet gas conduit a reactive gas so as to etch the solid thin film and produce a reaction product;

directing a gas containing the reaction product from the outlet gas conduit into an analysis chamber;

condensing the reaction product entering the analysis chamber onto a sample surface in the chamber to produce a surface of condensed reaction product;

bombarding the surface of the condensed reaction product to produce bombardment products and collecting the bombardment products in a mass spectrometer apparatus for analysis; and detecting the signal from the mass spectrometer apparatus to detect the presence of the layer of isotopically engineered material at the level of etching and adjusting an etch rate parameter in response to the detected signal.

28. The method of claim 27 wherein the etch rate parameter is adjusted so as to decrease the etch rate in response to the detected signal.

29. The method of claim 27 wherein the etch rate is controlled by an automatic or adaptive controller.

30. A method for determining etch rate of a thin film, comprising the steps of:

depositing first and second layers of isotopically engineered material at a known distance apart during growth of the solid thin film;

placing the solid thin film in an etch reactor having an inlet gas conduit and an outlet gas conduit;

introducing into the inlet gas conduit a reactive gas so as to etch the solid thin film and produce a reaction product;

directing a gas containing the reaction product from the outlet gas conduit into an analysis chamber;

condensing the reaction product entering the analysis chamber onto a sample holder in the chamber to produce a surface of condensed reaction product;

bombarding the surface of the condensed reaction product to produce bombardment products and collecting the bombardment products in a mass spectrometer apparatus for analysis;

observing the signal from the mass spectrometer apparatus to detect the presence of the first layer of isotopically engineered material;

continuing to etch until the second layer of isotopically engineered material is detected; and from the time between etching of the first and second layers and the known distance apart, calculate the etch rate between the first and second layers.

31. A method for determining the uniformity of etching of a thin film, comprising the steps of:

depositing a layer of isotopically engineered material during growth of the solid thin film;

placing the solid thin film in an etch reactor having an inlet gas conduit and an outlet gas conduit;

introducing into the inlet gas conduit a reactive gas so as to etch the solid thin film and produce a reaction product;

directing a gas containing the reaction product from the outlet gas conduit into an analysis chamber;

condensing the reaction product entering the analysis chamber onto a sample holder in the chamber to produce a surface of condensed reaction product;

bombarding the surface of the condensed reaction product to produce bombardment products and collecting the bombardment products in a mass spectrometer apparatus for analysis; and observing the signal from the mass spectrometer apparatus to determine the shape of the signal as the layer of isotopically engineered material is etched.

* * * * *